(12) United States Patent
Gagne et al.

(10) Patent No.: US 8,981,843 B2
(45) Date of Patent: Mar. 17, 2015

(54) TRANSLATOR INCLUDING OVERSTRESS PROTECTION

(71) Applicant: Fairchild Semiconductor Corporation, San Jose, CA (US)

(72) Inventors: Nickole Gagne, Saco, ME (US); Kenneth P. Snowdon, Falmouth, ME (US)

(73) Assignee: Fairchild Semiconductor Corporation, San Jose, CA (US)

( * ) Notice: Subject to any disclaimer, the term of this patent is extended or adjusted under 35 U.S.C. 154(b) by 0 days.

(21) Appl. No.: 13/792,699

(22) Filed: Mar. 11, 2013

(65) Prior Publication Data

US 2013/0321070 A1 Dec. 5, 2013

Related U.S. Application Data

(60) Provisional application No. 61/653,953, filed on May 31, 2012.

(51) Int. Cl.
*G05F 1/12* (2006.01)

(52) U.S. Cl.
CPC .................................... *G05F 1/12* (2013.01)
USPC ........................................... 327/589; 327/390

(58) Field of Classification Search
CPC .......... H03K 17/102; H03K 19/00315; H03K 17/063; H03K 2217/0054
USPC ......... 327/538, 536, 427, 434, 365, 387, 390, 327/540, 541, 589
See application file for complete search history.

(56) References Cited

U.S. PATENT DOCUMENTS

| | | | |
|---|---|---|---|
| 5,095,228 A | 3/1992 | Galbraith et al. | |
| 6,018,267 A | 1/2000 | Tran et al. | |
| 6,326,811 B1 | 12/2001 | Coddington et al. | |
| 7,164,305 B2 | 1/2007 | Gupta et al. | |
| 7,256,640 B2 | 8/2007 | Ucciardello et al. | |
| 7,528,634 B2 | 5/2009 | Can | |
| 8,525,574 B1 * | 9/2013 | Duggal | 327/390 |
| 2010/0098268 A1 | 4/2010 | Wong | |
| 2012/0274362 A1 * | 11/2012 | Doris et al. | 327/94 |

FOREIGN PATENT DOCUMENTS

CN 103457597 A 12/2013

OTHER PUBLICATIONS

"Chinese Application Serial No. 201320312498.6, Notification to Make Rectification mailed Dec. 12, 2013", 2 pgs.
"Chinese Application Serial No. 201320312498.6, Office Action mailed Sep. 4, 2013", 2 pgs.
"Chinese Application Serial No. 201320312498.6, Response filed Oct. 24, 2013 to Office Action mailed Sep. 4, 2013", 31 pgs.
"Chinese Application Serial No. 201320312498.6, Response filed Feb. 27, 2014 to Notification to Make Rectification mailed Dec. 12, 2013", w/English Claims, 9 pgs.

* cited by examiner

*Primary Examiner* — Jung Kim
(74) *Attorney, Agent, or Firm* — Schwegman Lundberg & Woessner, P.A.

(57) ABSTRACT

This document discusses, among other things, a control circuit, such as a translator circuit, configured to reduce voltage stress of first and second transistors when a first voltage received by the first transistor exceeds a voltage rating of at least one of the first or second transistors.

10 Claims, 5 Drawing Sheets

TRANSLATOR INCLUDING OVERSTRESS PROTECTION

CLAIM OF PRIORITY

This application claims the benefit of priority under 35 U.S.C. 119(e) to Gagne et al., U.S. Provisional Patent Application Ser. No. 61/653,953, entitled, "TRANSLATOR INCLUDING OVERSTRESS PROTECTION", filed May 31, 2012, which is hereby incorporated by reference herein in its entirety.

BACKGROUND

In certain applications, passgates are employed to pass a signal between two nodes of an electronic device. For example, passgate can be used to pass a signal from an electronic device such as a portable electronic device to an accessory device connected to the electronic device. Passgates can be used to pass analog signals, such as analog audio signals, between devices. Design criteria for passgate control circuits can influence how well a passgate can pass certain analog signals without introducing distortion, and how well a passgate isolates the two nodes when the passgate is not enabled. Some analog passgates and corresponding passgate controls are made using high-voltage processes such that the passgate and control circuits can withstand reception of higher voltage signals. Such high-voltage devices and processes to make such devices can add costs to products using such devices.

OVERVIEW

This document discusses, among other things, voltage over-stress protection such that low voltage components can be used in circuits, such as voltage translators of passgate circuits, that are susceptible to voltages that can stress the lower voltage components.

In certain examples, a control circuit can include a first transistor configured to receive a first voltage and to couple the first voltage to a control node of the analog passgate in a second state, wherein the first voltage is referenced to a voltage on a first node of the analog passgate. The control circuit can further include a second transistor coupled to the first transistor and the control node of the analog passgate and configured to operate as a source follower when a control signal is in the second state to reduce voltage stress of the first and second transistors when the first voltage exceeds a voltage rating of at least one of the first or second transistors.

In certain examples, the control circuit can include a third transistor coupled to the second transistor and a reference voltage. A control node of the first transistor and a control node of the second transistor can be configured to receive a second voltage. A control node of the third transistor can be configured to receive a representation of the control signal. The second and third transistors can be configured to couple the control node of the analog passgate to the reference voltage in the first state.

This section is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

The present inventors have recognized apparatus and methods of a high-voltage translator to control a passgate (e.g., an analog passgate) using low-voltage control components, such that a signal applied to the passgate can exceed a voltage rating of the low-voltage control components, and the structure of the control circuit can avoid over-voltage stress to the low-voltage control components. In certain examples, such a high-voltage translator can be used in audio switches, including constant gate-to-source voltage ($V_{GS}$) audio switches, and can result in smaller switches that have less capacitance and higher bandwidth than switches using higher voltage components.

Figure 1:
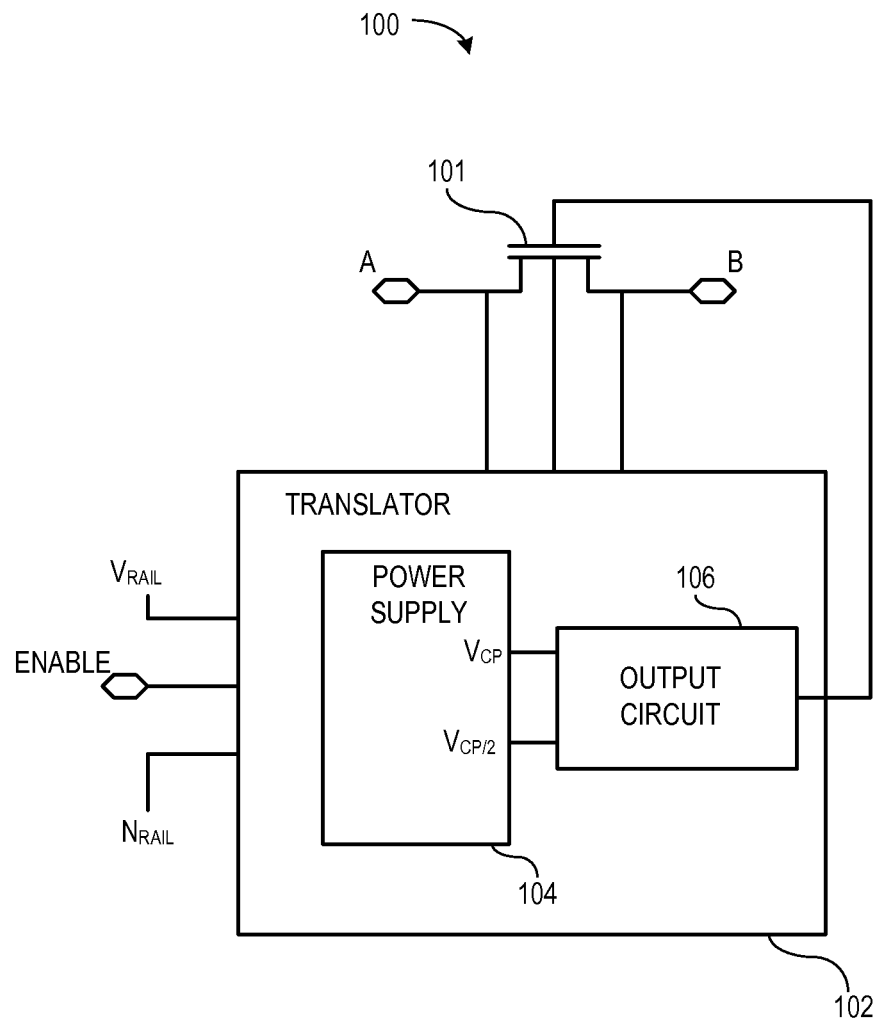
FIG. 1 illustrates generally a passgate system including an example translator.

FIG. 1 illustrates generally a passgate system 100 including a passgate 101 and an example translator 102. In certain examples, the passgate 101 can include a metal-oxide-semiconductor field-effect transistor (MOSFET). Operation of the passgate 101 can be responsive to a signal received on a control node of the passgate 101, such as the gate node of a MOSFET.

In a first state of operation, the passgate 101 can isolate a first node (A) from a second node (B). In a second state, the passgate 101 can provide a low-impedance path to couple the first node (A) with the second node (B). In some examples that include a transistor passgate, operation of the passgate 101 can depend on the voltage between one of the nodes (A, B) and the control node of the passgate 101.

In certain examples, the translator 102 can control the voltage of the control node of the passgate 101 to maintain a state of the passgate 101 even when a signal of at least one of the first or second nodes (A, B) is varying significantly. In certain examples, the translator 102 can receive a first supply voltage ($V_{RAIL}$), a second supply rail (or a reference potential) ($N_{RAIL}$), and a command input, such as a passgate enable input (ENABLE). The translator 102 can provide a representation of the signal at the passgate enable input (ENABLE) to the control node of the passgate 101, such that the passgate 101 can be responsive to the state of the signal.

In certain examples, the first supply voltage ($V_{RAIL}$) can be a voltage indicative of the highest voltage available to the translator 102, and the second supply rail ($N_{RAIL}$) can be a voltage indicative of the lowest voltage available to the translator 102. In some examples, the first supply rail ($V_{RAIL}$) can be coupled to a supply voltage and the second supply rail ($N_{RAIL}$) can be coupled to ground.

In certain examples, the translator 102 can include a power supply 104 that can maintain a proper voltage level of the control node of the passgate 101, and an output circuit 106 for driving the control node of the passgate 101. In certain examples, the power supply 104 of the translator 102 can include a first power supply that can supply a first voltage ($V_{CP}$) and a second power supply that can provide a second voltage ($V_{CP/2}$). In certain examples, the power supply 104 can include a charge pump that can provide the first voltage ($V_{CP}$) and another power supply that can supply the second voltage ($V_{CP/2}$). In some examples, the power supply 104 can include a two-stage charge pump that can provide the first voltage ($V_{CP}$) and the second voltage ($V_{CP/2}$). In certain examples, the power supply 104, or a portion thereof, can be separate from the translator 102.

In certain examples, the translator 102 can include an output circuit 106 configured to receive a first voltage ($V_{CP}$) and a second voltage ($V_{CP/2}$). The output circuit 106 can respond to a state of the passgate enable input (ENABLE) and drive the control node of the passgate 101 at a voltage sufficient to operate the passgate 101 in the state selected by the state of the signal at the passgate enable input (ENABLE).

In certain examples, the output circuit 106 can include circuit components having a given voltage rating, for example, a 5 volt voltage rating, indicating that voltages above the given voltage rating can stress the component. In certain rating systems, operating a component above its given rated voltage can shorten the operating life of the component. Extended operation of a component at voltage higher than a voltage rating of the component, in certain examples, can severely compromise the predictable operation of the component.

In certain examples, the translator 102 can introduce voltages that are offset from voltages received on the first or second nodes (A, B) of the passgate 101. In certain examples, such voltages can appear on the control node of the passgate 101 and can be coupled to components of the power supply 104 and the output circuit 106. These voltages can be higher than the voltage rating of many common, low-cost circuit elements, including low-cost circuit elements of the power supply 104 and the output circuit 106.

Figure 2A:
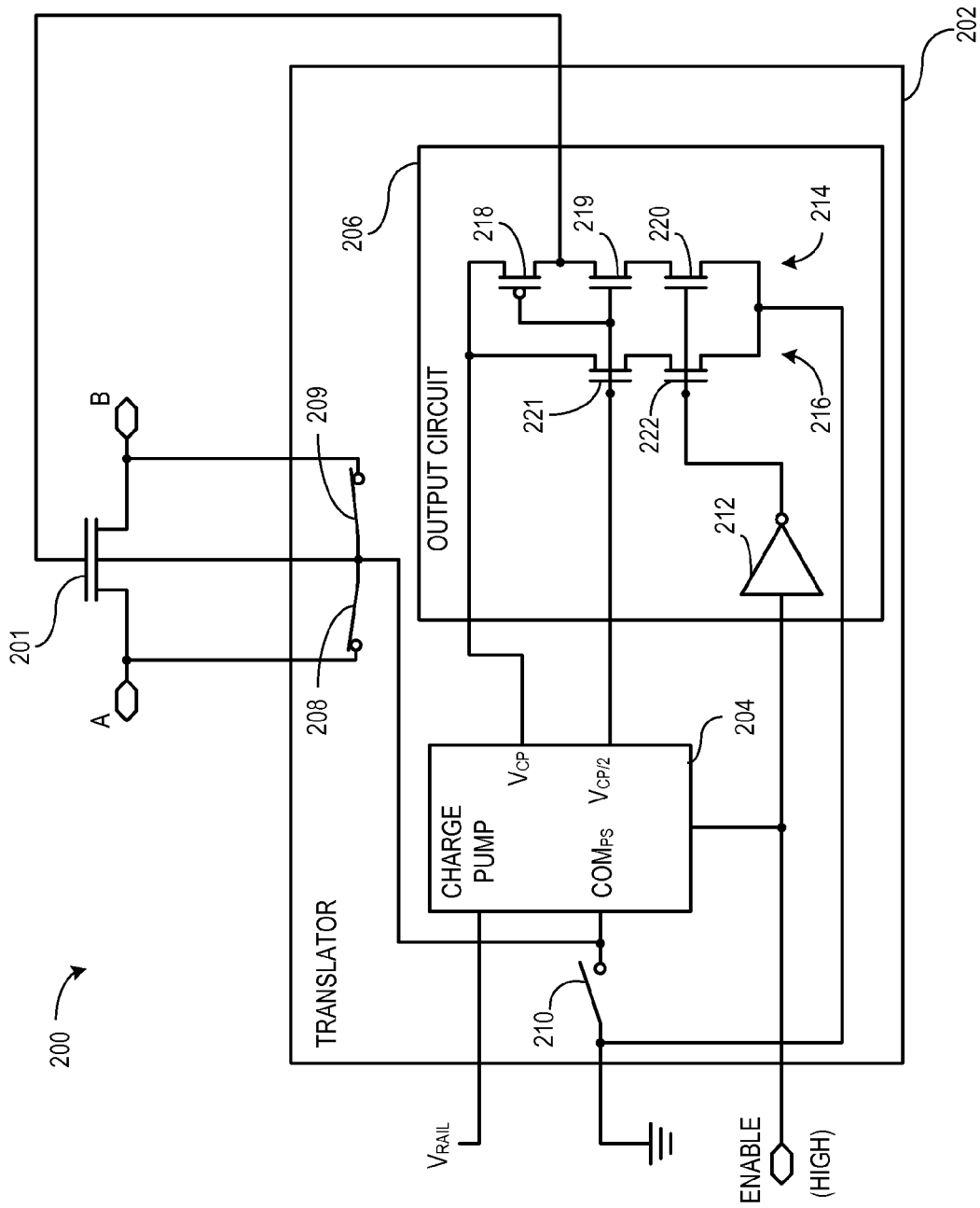
FIGS. 2A and 2B illustrate generally simplified circuit diagrams of a passgate system including an example translator controlling an NMOS passgate.
Figure 2B:
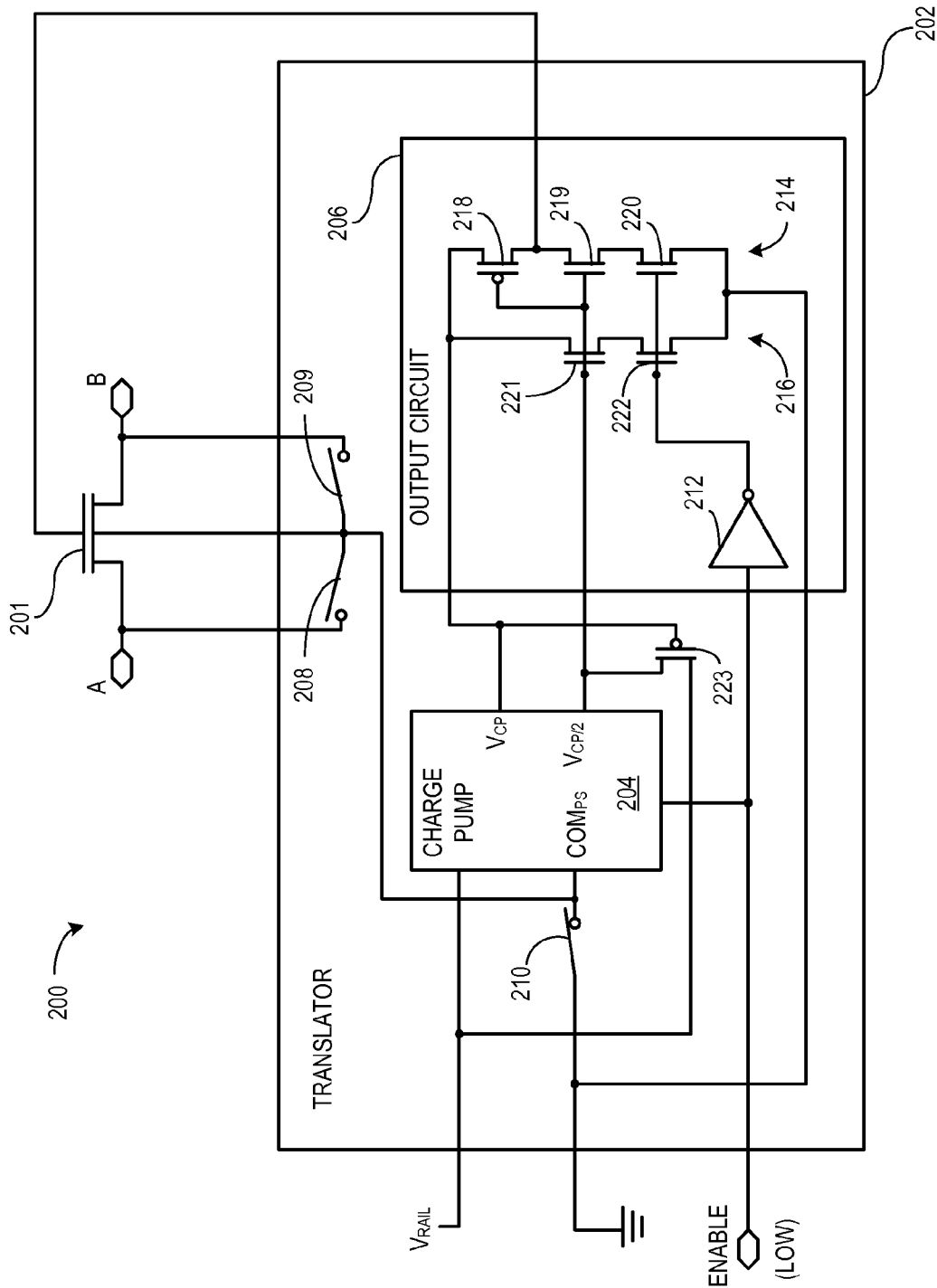

FIGS. 2A and 2B illustrate generally simplified circuit diagrams of a passgate system 200 including an example translator 202 controlling an NMOS passgate transistor 201 in a low-impedance state, or "ON" state, (FIG. 2A) and a high-impedance state, or "OFF" state, (FIG. 2B) responsive to a state of a passgate enable input (ENABLE). The passgate system 200 can include a passgate transistor 201 and a translator 202. In certain examples, the translator 202 can include an output circuit 206 including components having a voltage rating lower than a voltage expected to be applied to the translator 102.

FIG. 2A illustrates generally a simplified circuit of a passgate system 200 including an example translator 202. The translator 202 can receive a signal in a high state at the passgate enable input (ENABLE). The passgate enable input (ENABLE) can be coupled to a power supply 204, such as a charge pump, to enable the power supply 204 when the state of the signal is high. In certain examples, a signal different than the signal received at the passgate enable input (ENABLE) can be used to enable and disable the power supply 204. A high signal at the passgate enable input (ENABLE) can couple a common node of the power supply 204 to at least one of the first and second nodes (A,B) of the passgate system 200 using first and second switches 208, 209. In certain examples, the bulk of the passgate transistor 201 can be coupled to the common node of the power supply 204 and the first and second nodes (A, B) of the passgate system 200 using the first and second switches 208, 209. Such a configuration, in the low-impedance state of the passgate system 200 can allow the output of the power supply 204 to provide a first voltage ($V_{CP}$) that tracks, and is offset from, the voltage of the first or second nodes (A, B).

In an example, a third switch 210 can isolate the common of the power supply 204 from ground or a second supply rail (not shown).

In certain examples, the output circuit 206 can include an inverter 212 and a first branch circuit 214. The inverter can control the first branch circuit responsive to the state of the signal at the passgate enable input (ENABLE). The first branch circuit 214 can include a first transistor 218, a second transistor 219, and a third transistor 220 and is configured to control the voltage level of the control node of the passgate transistor 201.

In certain examples, the output circuit 206 can include a second branch circuit 216. The second branch circuit 216 can include a fourth transistor 221 and a fifth transistor 222. In certain examples, the second branch circuit 216 can couple an output of the power supply 204 to ground when the passgate system 200 is in the high-impedance state. In addition, the configuration of the second and fourth transistors 219, 221 can allow the passgate system 200 to pass signals that can induce voltages that exceed voltage ratings of the output circuit components without causing over-voltage stress to the output circuit components.

For example, with respect to FIG. 2A, with the passgate enable input (ENABLE) receiving a signal in a high state, the power supply 204 can be enabled and provide a first voltage ($V_{CP}$) and a second voltage ($V_{CP/2}$). In some examples, the power supply 204 can include a two-stage charge pump such that the second voltage ($V_{CP/2}$) is provided from a first stage of the two-stage charge pump and is about half the voltage of the first voltage ($V_{CP}$). In certain examples, the first voltage ($V_{CP/2}$) can be provided from the second stage of the two-stage charge pump. As a result of the given voltages ($V_{CP}$, $V_{CP/2}$), the first transistor 218, a PMOS transistor, can receive the second voltage ($V_{CP/2}$) and can be in a low-impedance state. Thus, the first transistor 218 can couple the control node of the passgate transistor 201 to the first voltage ($V_{CP}$). Since the first voltage ($V_{CP}$) can track the signal at the first or second nodes (A, B) of the passgate system 200 with a predetermined offset, the gate-to-source voltage ($V_{GS}$) of the passgate transistor 201 can be substantially constant allowing the passgate transistor 201 to introduce little or no distortion. In certain examples, the same coupling of the power supply 204 can cause the first voltage ($V_{CP}$) at the output of the power supply 204 to exceed voltage ratings of the transistors 218, 219, 220, 221, 222 of the output circuit 206. As discussed briefly above, the second and fourth transistors 219, 221 can operate to eliminate or reduce over-voltage stress of the transistors 220, 222 of the output circuit 206. Biasing the first transistor with the first voltage ($V_{CP/2}$) provides self stress protection of the first transistor 218 by limiting the gate-to-source voltage of the first transistor 218.

To illustrate the stress protection of the passgate system 200, consider the following non-limiting example. The voltage rating of the output circuit components is 5 volts. The signal received at the first node (A) includes a sinusoidal signal having a peak-to-peak voltage of 3 volts and an offset of 1.5 volts. The power supply 204 is configured to provide a first voltage ($V_{CP}$) of 4 volts with respect to the power supply common ($COM_{PS}$) and a second voltage ($V_{CP/2}$) of about 2 volts with respect to the charge pump commons ($COM_{PS}$). When the signal at the first node (A) is at a maximum, an output of the power supply 204 can be at about 7 volts with respect to ground. With the passgate transistor 201 in a low-impedance state, the control node of the passgate transistor 201 can be at about 7 volts via the first transistor 218. With the passgate enable input (ENABLE) at a high logic level, the control nodes of the third and fifth transistors 220, 222 are low and thus the third and fifth transistors 220, 222 are in a high-impedance state. The second and fourth transistor 219, 221 can receive the second voltage ($V_{CP/2}$) and can be in a source follower state such that the voltage across the third transistor and the fifth transistor 220, 222 is about the second voltage ($V_{CP/2}$), or more specifically, about the second voltage ($V_{CP/2}$) minus a transistor threshold voltage. Thus, in this example, the voltage across the second and fourth transistors 219, 221 can be limited to about 2 volts and the voltage across the third and fifth transistors 220, 222 can be limited to about 5 volts. In certain examples, the second and fourth transistors 219, 221 can limit the drain- to-source voltage ($V_{DS}$) of the third and fifth transistors 220, 222 such that the transistors 218, 219, 220, 221, 222 of the output circuit 206 can provide the desired functionality and can operate with a high voltage, avoiding over-voltage stress. In addition the transistors 218, 219, 220, 221, 222 of the output circuit 206 can be low-voltage transistors that are less expensive and use less resources to manufacture compared to high-voltage devices.

FIG. 2B illustrates generally a simplified circuit diagram of the passgate system 200, including an example translator 202, when the passgate transistor 201 is transitioning into or is in a low-impedance state. The translator 202 can receive a signal in a low state at the passgate enable input (ENABLE). The passgate enable input (ENABLE) can be coupled to the power supply 204 to disable the power supply 204 when the state of the passgate enable input (ENABLE) is low. A low signal at the passgate enable input (ENABLE) can decouple a common node ($COM_{PS}$) of the power supply 204 from both the first and second nodes (A, B) of the passgate system 200 using the first and second switches 208, 209.

In certain examples, the output circuit 206 can include a first branch circuit 214. The first branch circuit 214 can include a first transistor 218, a second transistor 219, and a third transistor 220 and can control the voltage level of the control node of the passgate transistor 201. In certain examples, the output circuit 206 can include a second branch circuit 216. The second branch circuit 216 can include a fourth transistor 221 and a fifth transistor 222. The second branch circuit 216 can couple the output of the power supply 204 to ground when the passgate system 200 is in a high-impedance state. In addition, the configuration of the second and fourth transistors 219, 221 can allow the passgate system 200 to pass signals that can induce voltages that exceed voltage ratings of the output circuit components without causing over-voltage stress to the output circuit components.

For example, with the passgate enable input receiving a signal in a high state, the power supply 204 can be enabled and can provide a first voltage ($V_{CP}$) and a second voltage ($V_{CP/12}$). In some examples, the power supply 204 can include a two-stage charge pump such that the second voltage ($V_{CP/2}$) is provided from a first stage of the two-stage charge pump and is about half the voltage of the first voltage ($V_{CP}$). The first voltage ($V_{CP}$) can be provided from the second stage of the two-stage charge pump. Upon receiving a low state signal at the passgate enable input (ENABLE), the power supply 204 can be disabled. In certain examples, the first stage of the power supply 204 can be isolated from the second stage when the power supply 204 is disabled. Since the first voltage ($V_{CP}$) tracks the signal at the first or second nodes (A, B) of the passgate transistor 201 with a predetermined offset, the voltage at an output of the power supply 204 can exceed voltage ratings of the transistors 218, 219, 220, 221, 222 of the output circuit 206.

As discussed above, the second and fourth transistors 219, 221 of the output circuit 206 of the translator 202 can operate to eliminate or reduce over-voltage stress of the transistors 218, 219, 220, 221, 222 of the output circuit 206. When the passgate transistor 201 is disabled, the control node of the passgate transistor 201 can be pulled to ground by the second and third transistors 219, 220 of the output circuit 206. The power supply output providing the first voltage ($V_{CP}$) can be pulled to ground using the fourth and fifth transistors 221, 222 of the output circuit 206. As the first voltage ($V_{CP}$) is pulled low, a sixth transistor 223 can couple the second voltage ($V_{CP/2}$) to a first supply rail ($V_{RAIL}$) of the passgate system 200. In certain examples, a third switch 210 can couple a bulk of the passgate transistor 201 to ground when the passgate transistor 201 is disabled. In certain examples, the ground can be an output of a under voltage discriminator. The under-voltage discriminator can receive a ground potential and one or more of the voltages at the first and second nodes (A, B) and can couple the lowest potential to the output of the under voltage discriminator. In certain examples, the sixth transistor 223 can be part of a two stage charge pump. In an example, the power supply 204, including the two stage charge pump, can be separate from the translator 202. In some examples, the second branch 216 can be part of the power supply 204.

Figure 3:
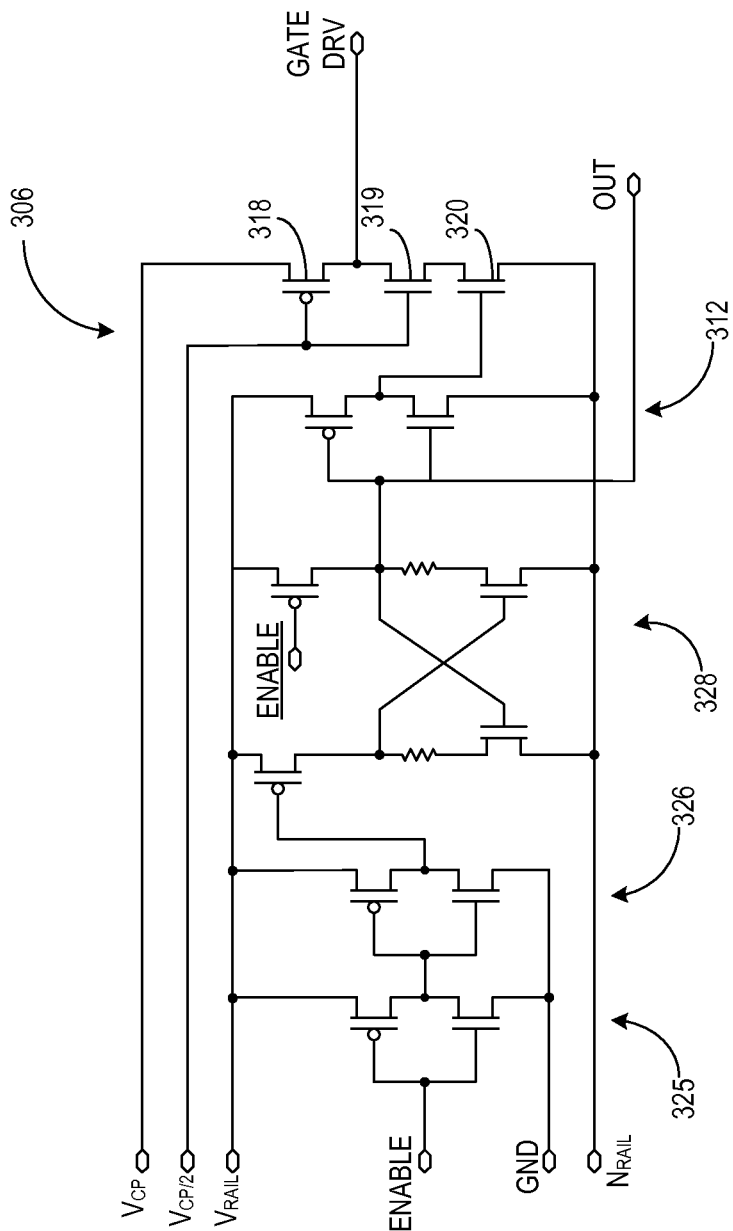
FIG. 3 illustrates generally an example translator.

FIG. 3 illustrates generally an example translator 302 that can include first, second, and third inverters 325, 326, 312, a translator network 328, and an output circuit 306. In certain examples, the translator 302 can receive a first supply rail ($V_{RAIL}$), a second supply rail ($N_{RAIL}$), a first voltage ($V_{CP}$), a second voltage ($V_{CP/2}$), and ground (GND). The translator 302 can provide two outputs (OUT, GATE DRV). The first output (OUT) can have a high logic state near the voltage on the first supply rail ($V_{RAIL}$) and a low logic state near the second supply rail ($N_{RAIL}$). The second output (GATE DRV) can have a high logic level near the first voltage ($V_{CP}$) and a low logic level near the voltage at the second supply rail ($N_{RAIL}$).

In certain examples, the output circuit 306 can include a first transistor 318, a second transistor 319, and a third transistor 320. The transistors 319, 320 can allow the second output (GATE DRV) to follow the voltage of the first voltage ($V_{CP}$) when the complimentary enable inputs (ENABLE, ENABLE) are in a first state. In an example, the control nodes of the first transistor 318 and the second transistor 319 can receive the second voltage ($V_{CP/2}$). In some examples, the second voltage ($V_{CP/2}$) is supplied by a voltage source that is separate from a voltage source that can supply the first voltage ($V_{CP}$). In some examples, the second voltage ($V_{CP/2}$) is supplied using a power supply that can supply the first voltage ($V_{CP}$). In certain examples, in the first state, the second voltage ($V_{CP/2}$) is lower than the first voltage ($V_{CP}$) by a predetermined voltage. Thus, the second output (GATE DRV) can be pulled to the first voltage ($V_{CP}$) via the first transistor 318.

The second transistor 319 can operate as a source follower in the first state and the third transistor 320 can be in a high-impedance state. In certain examples, the first voltage ($V_{CP}$) can exceed a voltage rating of each transistor 318, 319, 320 in the output circuit 306 in the first state. However, since the second transistor 319 can operate as a source follower, the first voltage ($V_{CP}$) can exceed a voltage rating of the transistors 318, 319, 320 in the output circuit 306 without causing over-voltage stress. The second transistor 319 can avoid subjecting the transistors 318, 319, 320 of the output circuit 306 to over-voltage stress by keeping the node between the second transistor 319 and the third transistor 320 at a voltage just below the second voltage ($V_{CP/2}$). The amount below the second voltage ($V_{CP/2}$) can be approximately the threshold voltage of the second transistor 319, in certain examples. A second voltage ($V_{CP/2}$) can be selected to keep the first transistor 318 in a low-impedance state in the first state and to keep the voltage across each of the transistors 318, 319, 320 of the output circuit 306 within their respective voltage rating when the first voltage is at a voltage higher then each transistor voltage rating.

When the signal at the complimentary enable inputs (ENABLE, ENABLE) transitions to a second state associated with disabling the passgate transistor, the second and third transistors 319, 320 can pull the second output (GATE DRV) to the second supply rail ($N_{RAIL}$). In certain circumstances, the second output (GATE DRV) can be at a voltage level above a voltage rating of the second and third transistors 319, 320 when the complimentary enable inputs (ENABLE, ENABLE) transition to the second state. However, when the third transistor 320 transitions from the high-impedance state to the low-impedance state, the voltage at the second output (GATE DRV) can be split across the second and third transistors 319, 320 to avoid over-voltage stress to either the second or third transistor 319, 320. As will be discussed below with regards to FIG. 4, over-voltage stress of the first transistor 318 can be avoided in the second state by disabling the power supply providing the first voltage ($V_{CP}$).

In the second state, a disabled state, the first voltage ($V_{CP}$) can be zero volts and the second voltage ($V_{CP/2}$) can be the voltage at the first supply rail ($V_{RAIL}$). In the second state, the first transistor 318 can have a positive gate-to-source voltage that can pinch the first transistor 318 "off". The second transistor 319 can be "on" and in a linear region of operation because the first supply rail ($V_{RAIL}$) is applied to the gate of the second transistor 319 and the drain of the second transistor 319 can be coupled to ground since the third transistor 320 has been biased. Therefore, in the second state, the first second and third transistors 318, 319, 320 can have a positive gate-to-source voltage such that the first transistor 318 is "off" and the second and third transistors 318, 319 are "on". With the first voltage at zero volts, there is no overstress in the circuit and the second output (GATE DRV) can go low.

The translator output section 306 including the first, second and third transistors 318, 319, 320 is shown in a context related to passgate control, however, it is understood that the stress protection provided by the output section 306 can be realized in other translator contexts and is not intended to be limited to passgate control applications.

Figure 4:
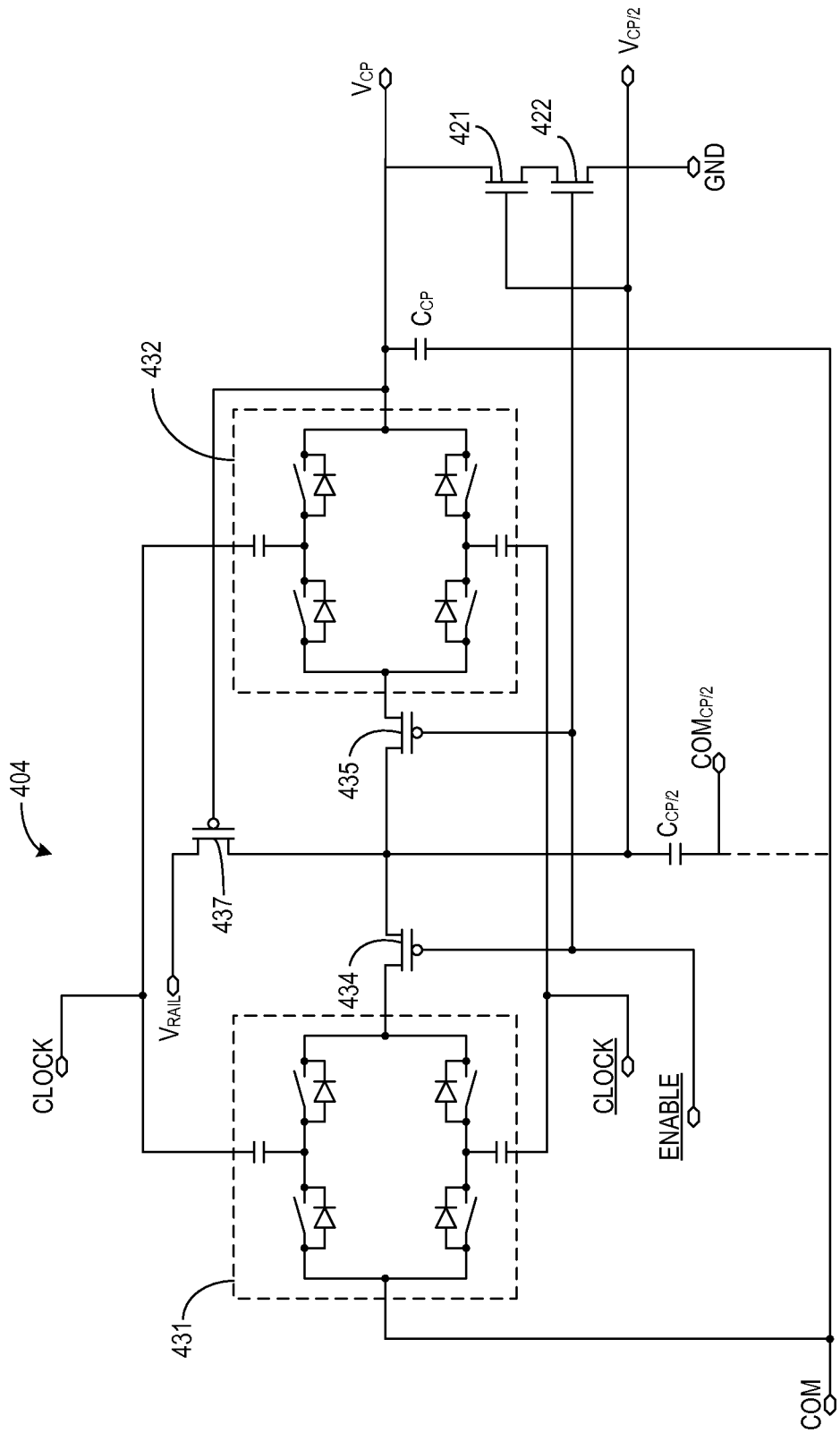
FIG. 4 illustrates generally an example two-stage charge pump including circuitry to avoid over-voltage stress of example translator output components.

FIG. 4 illustrates generally an example two-stage charge pump 404 including circuitry to avoid over-voltage stress of example translator output components, as well as example charge pump output components. In certain examples, the charge pump 404 can include a first stage 431 and a second stage 432 driven by complementary clock inputs (CLOCK, CLOCK). In an example, the first stage 431 can supply the second voltage ($V_{CP/2}$) and the first stage 431 coupled in series with the second stage 432 can supply the first voltage ($V_{CP}$). In certain examples, the second voltage ($V_{CP/2}$) can be about half the first voltage ($V_{CP}$) when referenced to the common node (COM) of the charge pump.

When used in a passgate system, such as the system illustrated in FIGS. 2A ands 2B, and the passgate is enabled in a low-impedance state, the first and second stages 431, 432 of the charge pump 404 can be coupled together via low-impedance states of first and second charge pump switches 434, 435. In certain examples the first and second charge pump switches 434, 435 can include transistors such as PMOS transistors, as illustrated. However, other switches are possible without departing from the scope of the present subject matter.

When the charge pump 404 is disabled, such as when the passgate is disabled, the charge pump output configured to supply the first voltage ($V_{CP}$) can be pulled to ground using charge pump output components, such as charge pump output transistors 421, 422. As discussed above with respect to FIG. 2A, when the passgate in enabled in a low-impedance state, the common node (COM) of charge pump 404 can be coupled to one of the nodes (A, B) of the passgate. As such, the first voltage ($V_{CP}$) can be at a voltage level that exceeds a voltage rating of the charge pump output transistors 421, 422. The charge pump 404 can include a first charge pump output transistor 421 and a second output transistor 422 arranged to control the level of the first voltage ($V_{CP}$) and to avoid over-voltage stress to either transistor, even though the transistors can have a voltage rating lower than a possible level of the first voltage ($V_{CP}$). In certain examples, when the charge pump 404 is enabled, along with the passgate, the control node of the first charge pump output transistor 421 can receive the second voltage ($V_{CP/2}$) and operate as a source follower. Thus, the voltage across the second charge pump output transistor 422 (e.g., the drain-to-source voltage ($V_{DS}$)) can vary with the second voltage ($V_{CP/2}$) In certain examples, the second voltage ($V_{CP/2}$) can vary with the voltage at the passgate nodes plus the voltage provided by the first stage of the charge pump. In some examples, the second voltage ($V_{CP/2}$) can be fixed with respect to ground (GND). For a two-stage charge pump, the voltage provided at the first stage can be selected to remain within the voltage rating of the charge pump output transistors 421, 422 without using high-voltage charge pump transistors.

In certain examples, when the charge pump 404 is disabled, the first stage output capacitor ($C_{CP/2}$) of the charge pump 404 can be isolated from the rest of the charge pump circuitry using the first and second charge pump switches 434, 435. In addition, the common node (COM) of the charge pump 404 can be coupled to ground, for example, using a switch controlled by an output of the translator or by the enable input to the pass gate system or representative signal thereof.

In an example, the control node of the first charge pump output transistor 421 can continue to receive the voltage ($V_{CP/2}$) from the first stage of the charge pump 404. In certain examples, the second charge pump output transistor 422 can be driven to a low-impedance state a signal at an enable input (ENABLE). Thus, the first voltage ($V_{CP}$) can be pulled to ground (GND) and can be divided across the first and second charge pump output transistors 421, 422 to avoid potential over-voltage stress. As the first voltage ($V_{CP}$) lowers to ground (GND), a third charge pump switch 437 can couple the isolated output of the first stage 431 of the charge pump 404 to the first supply rail ($V_{RAIL}$). In certain examples, coupling the first stage output of the charge pump 404 to the first supply rail ($V_{RAIL}$) can reduce a subsequent startup of the charge pump 404, and save energy, by maintaining some charge on the first stage capacitor ($C_{CP/2}$).

In certain examples, the common node (COM) of the charge pump 404 can be coupled to a well of the passgate transistor. In some examples, a common node ($COM_{CP/2}$) of the first stage of the charge pump can optionally be coupled to the common node (COM) of the charge pump. In some examples, the common node ($COM_{CP/2}$) of the first stage of the charge pump can optionally be coupled to a fixed supply source of the passgate circuit. In certain examples, the second voltage can be provided using a voltage divider coupled to a system power supply independent of the voltage at either of the passgate nodes. Such a voltage divider can be controlled using a transistor switch.

ADDITIONAL NOTES

In Example 1, a control circuit can be configured to couple to a control node of an analog passgate, the analog passgate configured to isolate a first node from a second node responsive to a first state of a control signal and to couple the first node to the second node responsive to a second state of the control signal. The control circuit can include a first transistor configured to receive a first voltage and to couple the first voltage to the control node of the analog passgate in the second state, wherein the first voltage is referenced to a voltage on the first node, a second transistor coupled to the first transistor and the control node of the analog passgate, and configured to operate as a source follower when the control signal is in the second state to reduce voltage stress of the first and second transistors when the first voltage exceeds a voltage rating of at least one of the first or second transistors, and a third transistor coupled to the second transistor and a reference voltage. A control node of the first transistor and a control node of the second transistor can be configured to receive a second voltage. A control node of the third transistor can be configured to receive a representation of the control signal, and the second and third transistors can be configured to couple the control node of the analog passgate to the reference voltage in the first state.

In Example 2, the first voltage of Example 1 optionally is configured to track the voltage on the first node and is offset from the voltage on the first node by a predetermined voltage during the second state.

In Example 3, the control circuit of any one or more of claims 1-2 optionally include a charge pump configured to provide the predetermined voltage.

In Example 4, the charge pump of any one or more of Examples 1-3 optionally is configured to provide at least a portion of the second voltage.

In Example 5, the second voltage of any one or more of Examples 1-4 optionally is offset from the first voltage by about half of the predetermined voltage.

In Example 6, the control circuit of any one or more of Examples 1-5 optionally includes a charge pump coupled to the first node, the charge pump configured to provide at least a portion of the first voltage.

In Example 7, the control circuit of any one or more of Examples 1-6 optionally includes a voltage source configured to provide the second voltage.

In Example 8, the control circuit of any one or more of Examples 1-7 optionally includes a voltage divider and a transistor configured to provide the second voltage independent of the voltage of the first or second nodes.

In Example 9, the charge pump of any one or more of Examples 1-8 optionally includes a first stage configured to provide the second voltage, and a second stage configured to provide at least a portion of the first voltage.

In Example 10, the charge pump of any one or more of Examples 1-9 optionally includes a first transistor coupled to an output of the second stage a second transistor coupled to the first transistor and ground, wherein the first and second transistor of the charge pump are configured to pull the output of the second stage to ground during the first state.

In Example 11, the charge pump of any one or more of Examples 1-10 optionally includes third and fourth transistors configured to isolate an output of the first stage from the second stage during the first state.

In Example 12, the charge pump of any one or more of Examples 1-11 optionally includes a fifth transistor having a control node coupled to the output of the second stage, wherein the fifth transistor is configured to couple the output of the first stage to a supply rail of the control circuit.

In Example 13, a method for controlling an analog passgate, the analog passgate configured to isolate a first node from a second node responsive to a first state of a control signal and to couple the first node to the second node responsive to a second state of the control signal, can include coupling a first voltage to a control node of the analog passgate using a first transistor responsive to the second state of the control signal, the first voltage offset from a voltage of the first node by a predetermined voltage, operating a second transistor as a source follower when the control signal is in the second state to reduce voltage stress of the first and second transistors when the first voltage exceeds a voltage rating of at least one of the first and second transistors, receiving a second voltage at control nodes of the first and second transistors when the control signal is in the second state, receiving a representation of the control signal at a third transistor, and coupling the control node of the analog passgate to a reference voltage using the second and third transistors when the control signal is in the first state.

In Example 14, the receiving the first voltage of any one or more of Examples 1-13 optionally includes summing a first predetermined voltage and a voltage of the first node to provide the first voltage.

In Example 15, the receiving the second voltage of any one or more of Examples 1-14 optionally includes summing a second predetermined voltage and a voltage of the first node to provide the second voltage. In Example 16, the second predetermined voltage of any one or more of Examples 1-15 optionally is about half of the first predetermined voltage.

In Example 17, the method of any one or more of Examples 1-16 optionally includes providing the second predetermined voltage using a first stage of a charge pump, and providing the first predetermined voltage using a second stage of the charge pump.

In Example 18, the coupling the control node of the analog passgate to a reference voltage of any one or more of Examples 1-17 optionally includes isolating the first stage of the charge pump from the second stage of the charge pump using a third and fourth transistor, receiving the first voltage at a control node of a fifth transistor, coupling an output of the second stage of the charge pump to the reference voltage using a fifth and sixth transistor, the output of the second stage of the charge configured to provide the first voltage, and coupling an output of the first stage of the charge pump to a supply rail of the control circuit using a seventh transistor during a first state of the control signal, a control gate of the seventh transistor coupled to the output of the first stage of the charge pump.

In Example 19, the receiving the second voltage of any one or more of Examples 1-18 optionally includes receiving a second voltage not referenced to the voltage at the first node.

In Example 20, the receiving the second voltage of any one or more of Examples 1-4 optionally includes providing the second voltage from a voltage divider coupled to a third transistor, wherein the third transistor is configured to couple the voltage divider between a supply voltage and a ground when the control signal is in the second state.

In Example 21, a system can include a passgate transistor to isolate a first node from a second node responsive to a first state of the control signal and to couple the first node to the second node responsive to a second state of the control signal, and a control circuit configured to receive the control signal. The control circuit can include a first transistor configured to receive a first voltage and to couple the first voltage to the control node of the passgate transistor in the second state, wherein the first voltage is referenced to a voltage on the first node, a second transistor coupled to the first transistor and the control node of the passgate transistor, and configured to operate as a source follower when the control signal is in the second state to reduce voltage stress of the first and second transistors when the first voltage exceeds a voltage rating of at least one of the first or second transistors, and a third transistor coupled to the second transistor and a reference voltage. A control node of the first transistor and a control node of the second transistor can be configured to receive a second voltage. A control node of the third transistor is configured to receive a representation of the control signal. The second and third transistors are configured to couple the control node of the passgate transistor to the reference voltage in the first state. The above detailed description includes references to the accompanying drawings, which form a part of the detailed description. The drawings show, by way of illustration, specific embodiments in which the invention can be practiced. These embodiments are also referred to herein as "examples." All publications, patents, and patent documents referred to in this document are incorporated by reference herein in their entirety, as though individually incorporated by reference.

In the event of inconsistent usages between this document and those documents so incorporated by reference, the usage in the incorporated reference(s) should be considered supplementary to that of this document; for irreconcilable inconsistencies, the usage in this document controls. In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. In other examples, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. A control circuit configured to couple to a control node of an analog passgate, the analog passgate configured to isolate a first node from a second node responsive to a first state of a control signal and to couple the first node to the second node responsive to a second state of the control signal, the control circuit comprising:
    a first transistor configured to receive a first voltage and to couple the first voltage to the control node of the analog passgate in the second state, wherein the first voltage is referenced to a voltage on the first node;
    a second transistor coupled to the first transistor and the control node of the analog passgate, and configured to operate as a source follower when the control signal is in the second state to reduce voltage stress of the first and second transistors when the first voltage exceeds a voltage rating of at least one of the first or second transistors;
    a third transistor coupled to a reference voltage and directly coupled to the second transistor;
    a charge pump coupled to the first node, the charge pump configured to provide at least a portion of the first voltages;
    a voltage source configured to provide the second voltage; and
    a voltage divider and a transistor configured to provide the second voltage independent of the voltage of the first or second nodes;
    wherein a control node of the first transistor and a control node of the second transistor are configured to receive a second voltage;
    wherein a control node of the third transistor is configured to receive a representation of the control signal; and
    wherein the second and third transistors are configured to couple the control node of the analog passgate to the reference voltage in the first state.

2. The control circuit of claim 1, wherein the first voltage is configured to track the voltage on the first node and is offset from the voltage on the first node by a predetermined voltage during the second state.

3. The control circuit of claim 2, including a charge pump configured to provide the predetermined voltage.

4. The control circuit of claim 3, wherein the charge pump is configured to provide at least a portion of the second voltage.

5. The control circuit of claim 4, wherein the second voltage is offset from the first voltage by about half of the predetermined voltage.

6. The control circuit of claim 1, wherein the charge pump includes
    a first stage configured to provide the second voltage; and
    a second stage configured to provide at least a portion of the first voltage.

7. The control circuit of claim 6, wherein the charge pump includes:
    a first transistor coupled to an output of the second stage;
    a second transistor coupled to the first transistor and ground;
    wherein the first and second transistor of the charge pump are configured to pull the output of the second stage to ground during the first state.

8. The control circuit of claim 6, wherein the charge pump includes:
    third and fourth transistors configured to isolate an output of the first stage from the second stage during the first state.

9. The control circuit of claim 7, wherein the charge pump includes a fifth transistor having a control node coupled to the output of the second stage, wherein the fifth transistor is configured to couple the output of the first stage to a supply rail of the control circuit.

10. A system comprising:
    a passgate transistor to isolate a first node from a second node responsive to a first state of a control signal and to couple the first node to the second node responsive to a second state of the control signal; and a control circuit configured to receive the control signal, the control circuit including:
- a first transistor configured to receive a first voltage and to couple the first voltage to the control node of the passgate transistor in the second state, wherein the first voltage is referenced to a voltage on the first node;
- a second transistor coupled to the first transistor and the control node of the passgate transistor, and configured to operate as a source follower when the control signal is in the second state to reduce voltage stress of the first and second transistors when the first voltage exceeds a voltage rating of at least one of the first or second transistors;
- a third transistor coupled to a reference voltage and directly coupled to the second transistor;
- a charge pump coupled to the first node, the charge pump configured to provide at least a portion of the first voltage;
- a voltage source configured to provide the second voltage; and
- a voltage divider and a transistor configured to provide the second voltage independent of the voltage of the first or second nodes;

wherein a control node of the first transistor and a control node of the second transistor are configured to receive a second voltage;

wherein a control node of the third transistor is configured to receive a representation of the control signal; and wherein the second and third transistors are configured to couple the control node of the passgate transistor to the reference voltage in the first state.

* * * * *